United States Patent [19]

Walker

[11] 4,455,528
[45] Jun. 19, 1984

[54] OSCILLATOR COIL SENSING HEAD FOR CONTACTLESS INDUCTIVE PROXIMITY SWITCH

[75] Inventor: Heinz Walker, Kümmersbruck, Fed. Rep. of Germany

[73] Assignee: Siemens Aktiengesellschaft, Berlin and Munich, Fed. Rep. of Germany

[21] Appl. No.: 284,998

[22] Filed: Jul. 20, 1981

[30] Foreign Application Priority Data

Jul. 30, 1980 [DE] Fed. Rep. of Germany ....... 3028939

[51] Int. Cl.³ .......................................... G01R 33/12
[52] U.S. Cl. .................................. 324/327; 324/236; 331/65; 331/108 D; 336/83
[58] Field of Search ................. 331/65, 108 D, 117 R, 331/167; 324/327, 207, 236; 340/551; 361/180, 203; 336/83

[56] References Cited

U.S. PATENT DOCUMENTS 3,743,853 7/1973 Dittman et al. ................. 331/117 R
3,996,510 12/1976 Guichard ............................ 324/327

FOREIGN PATENT DOCUMENTS 7307974 2/1973 Fed. Rep. of Germany.
2618231 4/1976 Fed. Rep. of Germany.

OTHER PUBLICATIONS

Siemens AG, "Bauelemente fürinductive Näherungsschalter" Datenbuch 1976/77, pp. 2, 3, 14–23.
Siemens AG, "Lineare Schaltungen", Datenbuch 1979/80, pp. 166–167.

Primary Examiner—Siegfried H. Grimm
Attorney, Agent, or Firm—Kenyon & Kenyon

[57] ABSTRACT

A contactless inductive proximity switch contains an oscillator which is formed of a parallel arrangement of an oscillator coil and an oscillator capacitor connected to an integrated circuit. The oscillator coil is provided with a relatively few number of wire turns so as to occupy a relatively small portion of the volume in the cup core. The capacity of the oscillator capacitor is selected to match the oscillator coil. A hard water is retained within the cup core by a casting resin, and protects the oscillator coil from damage.

2 Claims, 2 Drawing Figures

OSCILLATOR COIL SENSING HEAD FOR CONTACTLESS INDUCTIVE PROXIMITY SWITCH

BACKGROUND OF THE INVENTION

This invention relates generally to contactless switches, and more particularly, to a contactless inductive proximity switch having an oscillator formed with an oscillator coil, the oscillator coil being contained within a cup core and covered by a ceramic portion.

German Petty Pat. No. 7,307,974 describes a contactless inductive proximity switch having a protective cap formed of an oxide ceramic material. The bottom surface of the proximity switch is relatively thin and disposed entirely within the core of a cup, in an inverted position. The bottom surface is made thin so that the response range of the proximity switch is not excessively reduced. The response range, however, is nevertheless reduced as a result of the cup core surfaces being covered by the ceramic material.

German Reference DE-OS No. 26 18 231 describes an arrangement wherein the operator of a two-wire AC voltage proximity switch is protected in the event that the insulation or the housing of the oscillator coil within the switch is damaged. The arrangement described therein prevents the operator from coming in contact with network potential by providing a separate transformer which provides potential isolation. This solution to a safety problem, however, has the disadvantages of being more expensive and subject to transmission losses

SUMMARY OF THE INVENTION

The foregoing and other problems in the prior art are solved by this invention which provides a proximity switch wherein the oscillator coil is reliably protected against external influences, without adversely affecting the response range. In accordance with the principles of the invention, the foregoing is achieved by forming an oscillator coil having relatively few wire turns therein, the capacity of an oscillator capacitor being matched accordingly to achieve a desired frequency of resonance. The inventive arrangement further utilizes an integrated circuit for performing electronic phase reversal. A hard washer is used as the ceramic for filling the remaining space in the cup core. This arrangement permits the response surfaces of the cup core to be maintained free of coatings, so that the response range of the proximity switch is not adversely affected.

In one embodiment, the oscillator coil winding is reduced in size so as to occupy only about one-third of that required by prior art arrangements. This permits the hard washer to be formed of a relatively thick material, thereby advantageously permitting fastening of the washer to be achieved by casting in with a casting resin. This arrangement provides effective protection against piercing of the front surface of the proximity switch and damage to the oscillator coil.

BRIEF DESCRIPTION OF THE DRAWINGS

Comprehension of the invention is facilitated by reading the following detailed description in conjunction with the annexed drawings, in which.

DETAILED DESCRIPTION

Figure 1:
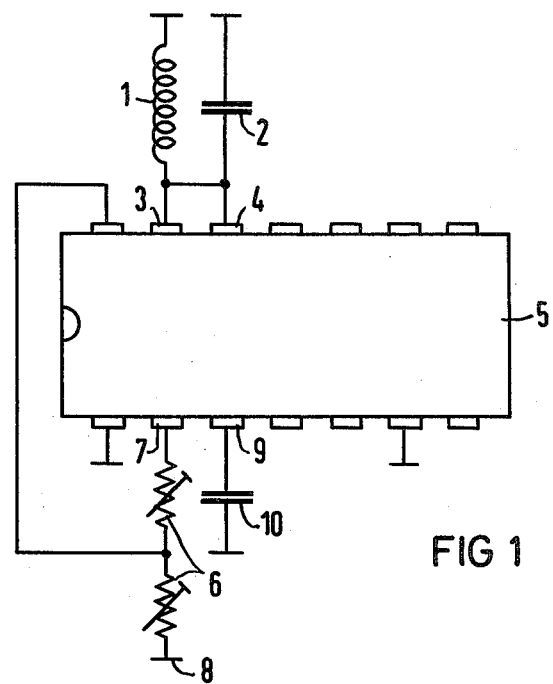
FIG. 1 is a block and schematic representation of a basic circuit arrangement constructed in accordance with the invention.

FIG. 1 shows a block and schematic representation of a circuit arrangement for an inductive proximity switch wherein an oscillator circuit is formed by a parallel connection of an oscillator coil 1 and an oscillator capacitor 2. Coil 1 and capacitor 2 operate as a resonant LC oscillator timing circuit and are connected to respective terminals 3 and 4 of an integrated circuit 5. Integrated circuit 5 may be of a commercially available type, such as TCA 205 A. A resistive divider 6 permits adjustment of the range of the switch and the setting of a precise hysteresis. The resistive divider circuit is connected between terminal 7 of integrated circuit 5 and a ground terminal 8. A capacitor 10 is interconnected between terminal 9 of the integrated circuit and ground for converting the AC voltage oscillator signal, after being rectified in a demodulator portion of the integrated circuit, into an analog, smoothened DC voltage. A practicable embodiment of the invention is provided with further circuit elements (not shown), such further circuit elements being external to the integrated circuit and including a bridge rectifier, a control current source, and a thyristor which is used as a switching element. This additional circuitry adapts the proximity switch to perform AC voltage switching. A multiplicity of individual transistors and an additional feedback coil for the proximity switch are obviated by using integrated circuit 5 to perform the electronic phase reversal function.

Figure 2:
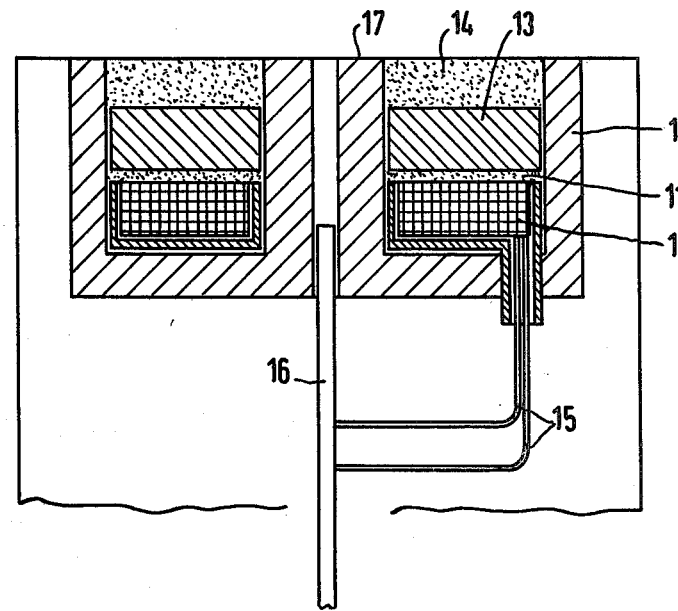
FIG. 2 is a cross-sectional view of the physical construction of the switch head of the proximity switch, constructed in accordance with the principles of the invention.

FIG. 2 shows the physical construction of the inductive proximity switch. Oscillator coil 1, as shown, occupies only approximately one-third of interior volume 11 of cup core 12. A washer 13 is placed into the interior of cup core 12, and is relatively thick, illustratively occupying one-third of the space in the cup core. The remaining space is filled with a casting resin 14. A pair of leads 15 from oscillator coil 1 are brought to a circuit board 16. As can be seen in FIG. 2, response surfaces 17 of cup core 12 are free of coatings, so that the switching range is not adversely affected.

Although the invention herein has been described in terms of specific embodiments, other embodiments, in light of this teaching, would be obvious to persons skilled in the pertinent art. Accordingly, it is to be understood that the drawings and descriptions in this disclosure are merely illustrative of the principles of the invention and should not be construed to limit the scope thereof.

What is claimed is:

1. An oscillator circuit with a cup core sensing head, comprising:
    oscillator coil means contained within the cup core, said oscillator coil means having a predetermined number of wire turns so as to occupy only a relatively small portion of a volume in the cup core;
    oscillator capacitor means having a predetermined capacity and connected to said oscillator coil means for forming a resonant LC oscillator timing circuit;
    washer means disposed within the cup core and outward of said oscillator coil means; and
    integrated circuit means connected to said oscillator coil means and said oscillator capacitor means for producing an electronic phase reversal.

2. The oscillator circuit of claim 1 wherein there is further provided casting resin means for securing said washer means within the cup core.

* * * * *